United States Patent [19]
Ellis et al.

[11] Patent Number: 5,413,821
[45] Date of Patent: May 9, 1995

[54] PROCESS FOR DEPOSITING CR-BEARING LAYER

[75] Inventors: Timothy W. Ellis; Thomas A. Lograsso, both of Ames, Iowa; Mark A. Eshelman, Kentwood, Mich.

[73] Assignee: Iowa State University Research Foundation, Inc., Ames, Iowa

[21] Appl. No.: 273,978

[22] Filed: Jul. 12, 1994

[51] Int. Cl.6 .............................................. B05D 3/06
[52] U.S. Cl. .................................. 427/576; 427/180; 427/249; 427/252; 427/255.3; 427/256; 427/577
[58] Field of Search ............... 427/576, 577, 249, 252, 427/255.3, 256, 180, 448, 450, 453, 455

*Primary Examiner*—Bernard Pianalto
*Attorney, Agent, or Firm*—Edward J. Timmer

[57] ABSTRACT

A method of applying a Cr-bearing layer to a substrate, comprises introducing an organometallic compound, in vapor or solid powder form entrained in a carrier gas to a plasma of an inductively coupled plasma torch or device to thermally decompose the organometallic compound and contacting the plasma and the substrate to be coated so as to deposit the Cr-bearing layer on the substrate. A metallic Cr, Cr alloy or Cr compound such as chromium oxide, nitride and carbide can be provided on the substrate. Typically, the organometallic compound is introduced to an inductively coupled plasma torch that is disposed in ambient air so to thermally decompose the organometallic compound in the plasma. The plasma is directed at the substrate to deposit the Cr-bearing layer or coating on the substrate.

14 Claims, 5 Drawing Sheets

PROCESS FOR DEPOSITING CR-BEARING LAYER

CONTRACTUAL ORIGIN OF THE INVENTION

This invention was made with Government support under Contract No. W-7405-ENG-82 awarded by the Department of Energy. The Government has certain rights in the invention.

FIELD OF THE INVENTION

The present invention relates to deposition of Cr, Cr alloys and Cr-bearing compounds such as oxides, nitrides and carbides on substrates.

BACKGROUND OF THE INVENTION

Electroplating of chromium (Cr) is an important and mature technology that has been used in a variety of applications including metal and plastic plating and hard facing of finished parts. However, there has been a major concern over the waste stream that Cr plating generates. For example, contamination of ground water by Cr VI (hexavalent Cr) solutions was such a serious problem in Corvalis, Oreg., that a Superfund was created for clean up of that site. As a result of contamination problems of this type and the carcinogenic nature of some hexavalent Cr solutions, the cost of waste disposal has been steadily rising to the point where the overall cost of Cr plating has become prohibitive and uneconomical to many manufacturers. There exists a great need for a process for applying Cr to substrates without producing vast quantities of waste solution that must be properly disposed of at high cost.

Several techniques have been attempted to address this problem. For example, one technique involves processing of the electroplating bath and wash water through ion exchange columns to thereby chemically change Cr VI (hexavalent Cr) to Cr III (trivalent Cr), providing a recoverable by-product. Such a technique is disadvantageous in that the generated wash water solutions are too dilute and the amount of water used is so large as to make this technique industrially impractical. Such techniques are described by Leatherdale et al. in *Society of Automotive Engineers Transactions*, 100:1:1 (1991) #910920,1 and by Haung et al. in *Journal of Chemical Engineering of Japan*, 24:2 (1991) 149.

Another technique directed at solving the aforementioned problem involves changing the nature of the wet chemical bath so that Cr VI complex solutions are generated in smaller quantities than with use of earlier conventional Cr electroplating baths as described, for example, by Zaki et al. in *Metal Finishing*, 88:6 (1990) 99. In particular, trivalent Cr plating baths are described wherein precautions are taken to prevent or reduce oxidation of trivalent Cr to hexavalent Cr. While such a technique is inviting as a short term solution to the problem, it appears highly probable that chromium-bearing effluent solutions from such processes will be subject to strict environmental scrutiny in the future given the potential for toxity problems associated with heavy metal electroplating solutions.

An object of the present invention is to provide a deposition method, as well as coated substrate, that eliminates altogether the generation of heavy metal waste solutions associated heretofore with Cr electroplating and thereby eliminates the waste solution disposal problem.

Another object of the present invention is to provide a deposition method, as well as coated substrate, for Cr and alloys thereof and Cr-bearing compounds, such as oxides, nitrides and carbides, using chromium organometallic compounds thermally decomposed in an inductively coupled plasma.

SUMMARY OF THE INVENTION

The present invention provides a method of applying a Cr-bearing layer to a substrate without the generation of waste heavy metal solutions. The method of the invention comprises introducing a chromium-bearing organometallic compound, such as, for example, chromium carbonyl, chromium acetate, chromium acetylacetonate, or chromium 2-ethylhexanoate, to an inductively coupled plasma to thermally decompose the organometallic compound and communicating the plasma and the substrate to be coated so as to deposit a chromium-bearing layer on the substrate. The organometallic compound can be introduced to the plasma as a vapor or solid powder entrained in an inert carrier gas. The Cr-bearing layer may comprise chromium metal, chromium alloy such as Cr—Ni, and Cr-bearing compounds such as chromium oxides, nitrides and carbides depending upon the particular organometallic compound used and its concentration in the carrier gas.

The organometallic compound typically is introduced to a plasma formed by an inductively coupled plasma torch so as to thermally decompose the organometallic compound in the plasma.

In a particular working embodiment of the invention, a Cr-bearing layer is applied to a substrate by introducing the chromium-bearing organometallic compound in a carrier gas to an inductively coupled plasma torch that is disposed in ambient air. The organometallic compound is thermally decomposed within the torch, and the torch plasma is contacted with the substrate to be coated so as to deposit a Cr-bearing layer on the substrate.

In another embodiment of the invention, a substrate surface to be coated is disposed in a chamber, a chromium-bearing organometallic compound and a plasma forming gas are introduced into the chamber, and the organometallic compound and plasma forming gas are heated in the chamber by inductive coupling with an RF source to form a plasma and thermally decompose the organometallic compound for deposition of a Cr-bearing layer on the substrate surface in the chamber.

The invention also provides a substrate and a Cr-bearing layer deposited on the substrate from a plasma of an inductively coupled plasma torch.

The objects and advantages of the present invention will become more readily apparent from the following detailed description taken with the drawings.

DETAILED DESCRIPTION

The present invention provides a method of applying a Cr-bearing layer or coating on a substrate that can comprise a variety of substrate materials including metals, alloys, high temperature plastics, and ceramics. The Cr-bearing layer may comprise chromium metal, chromium alloy such as Cr—Ni, and Cr-bearing compounds such as chromium oxides, nitrides and carbides depending upon the particular organometallic compound used and its concentration in the carrier gas.

The method of an embodiment of the invention involves thermally decomposing a chromium-bearing organometallic compound, such as, for example, chromium carbonyl, chromium acetate, chromium acetylacetonate, tetramethylchromium, chromium atraine complex described below, chromium 2-ethylhexanoate and others, in an inductively coupled plasma to thermally decompose the organometallic compound. The quantity of the organometallic compound in the carrier gas is controlled to provide a source of chromium for direct deposition on the substrate as a metallic Cr layer when the plasma and the substrate are contacted. Alternately, the organometallic compound can be present in such quantity in the carrier gas to provide a source of chromium and a compound-forming species such as oxygen, nitrogen and carbon is also present to form a chromium oxide, nitride, carbide or carbonitride on the substrate. Still further, a second metal-bearing organometallic compound such as, for example, nickel or silicon carbonyl, can be present in the carrier gas to deposit another metal (e.g. Ni or Si) along with Cr on the substrate to form a Cr alloy layer thereon.

An inductively coupled plasma involves a plasma formed by impingement of a plasma-forming gas with electromagnetic radiation from a coil or other source and whose frequency is effective to result in heating of the plasma-forming gas to a temperature to form a plasma. The frequency used will depend on the composition of the plasma-forming gas used. For example, oxygen, nitrogen, methane and other gases may be present with an inert gas, such as argon, in the plasma-forming gas to vary plasma properties.

The chromium bearing organometallic compound typically is introduced to the plasma as a vapor or solid powder entrained in a carrier gas, such as argon, as will become clear from the following description. The organometallic compound is thermally decomposed by the heat of the plasma. The composition of the coating or layer deposited on the substrate can be controlled in part by selection of the composition or type of chromium bearing compound used and its concentration in the carrier gas. Other parameters affecting the composition of the coating or layer deposited on the substrate are substrate temperature, electrical power level provided to the inductively coupled plasma torch (coupling coil) to be described, and the distance of the substrate from the end of the torch.

Figure 1:
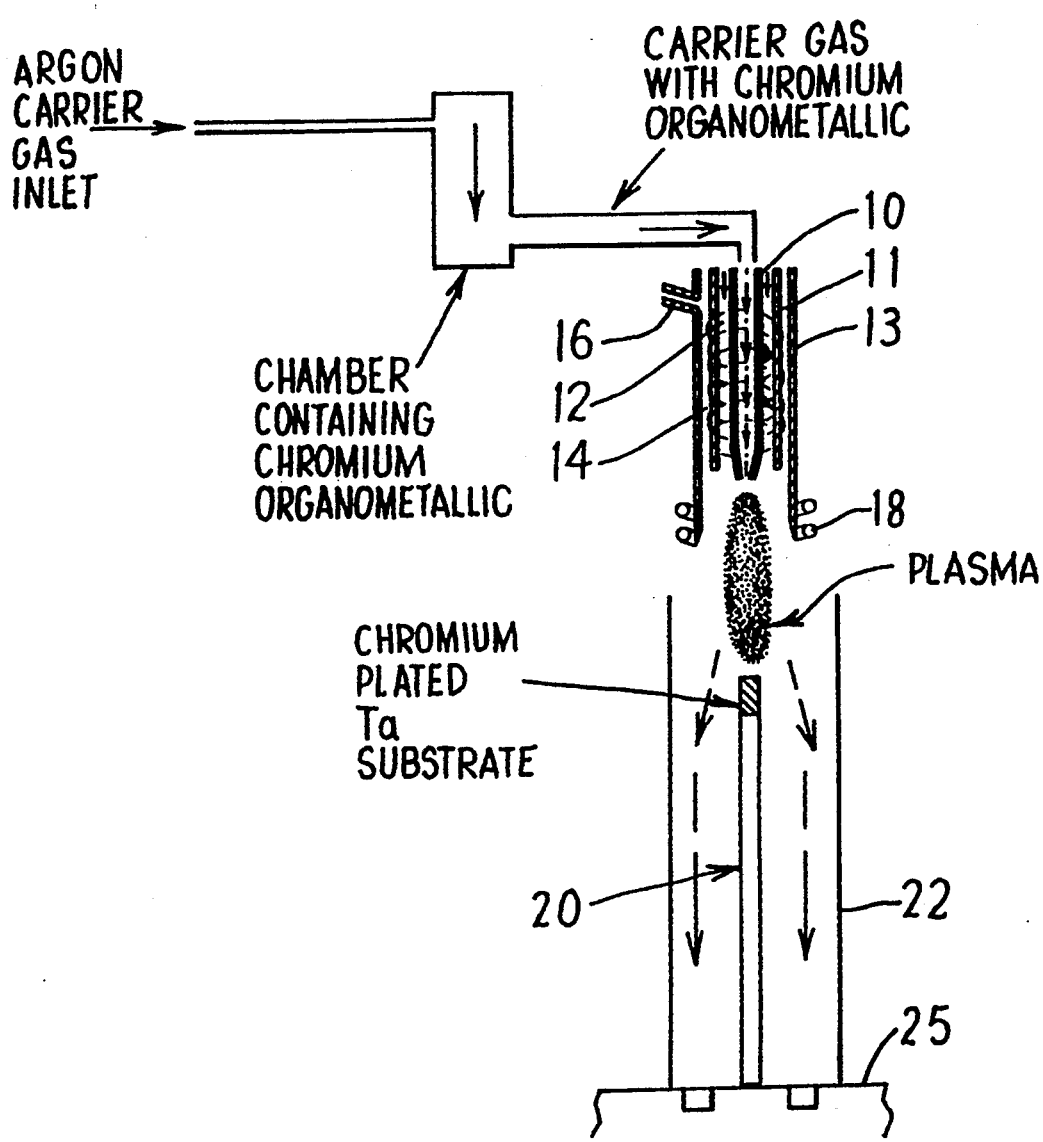
FIG. 1 is a schematic view of an inductively coupled plasma torch for practicing one embodiment of the invention using a vapor of the organometallic compound in a carrier gas.

FIG. 1 illustrates a preferred embodiment for practicing the invention using an inductively coupled plasma torch. In this embodiment of the invention, the chromium bearing organometallic compound, such as for example only chromium carbonyl, is housed in a container through which an argon carrier gas is flowed. The organometallic compound is sublimed to a gaseous vapor in the container by heating, if necessary, the container with an external heater (not shown) to achieve a desired compound decomposition temperature. Preferred, organometallic compounds are those that sublime or vaporize from liquid at around 20° C. (room temperature).

The temperature of the organometallic compound can be controlled in order to vary its vapor pressure and thus the relative amount of the compound in the carrier gas. As mentioned above, the amount of organometallic compound in the carrier gas is controlled in a manner to deposit a metallic Cr layer, Cr alloy layer or Cr-bearing compound layer (e.g. chromium oxide, nitride, or carbide) on the substrate or concentration.

The carrier gas picks up the organometallic compound vapor, such as for example only chromium carbonyl vapor, and the gaseous mixture of carrier gas/organometallic compound is introduced to an inductively coupled plasma torch where the organometallic compound thermally decomposes in the plasma established in the torch to provide a source of chromium atoms and/or ions (chromium species) in the plasma. In particular, the carrier gas/organometallic compound mixture is introduced to a center quartz tube 10 of the torch shown in FIG. 1. Concurrently, argon gas (without the organometallic compound) is introduced to the intermediate annular chamber 12 between quartz tubes 10, 11 and outer annular chamber 14 between quartz tubes 11, 13 of the torch via a side tube (only side tube 16 shown for the outer annular chamber 14, the side tube for intermediate chamber 12 being similar). The outer argon gas flow functions as a coolant flow to protect the tube walls and acts as the main plasma forming and sustaining gas. The argon gas flow through the intermediate chamber 12 functions to cool the center quartz tube 10 by pushing the plasma away.

The inductively coupled plasma torch provides an electrodeless discharge in argon or other inert gas in ambient air at atmospheric pressure, the plasma being formed and maintained by energy from a radio frequency (RF) generator (not shown) coupled to the plasma via a water cooled, copper coupling coil 18 proximate the end of the outer tube 13. The invention is not limited to RF energy and can be practiced at other frequencies depending upon plasma-forming gas composition to generate a plasma.

The plasma is generated inside and at the open of the outer tube 13. The quartz tubes 10, 11, 13 and the coupling coil 18 constitute the inductively coupled plasma torch. Inductively coupled plasma torches are described by Jarvis et al. in *Handbook of Inductively Coupled Plasma Mass Spectrometry,* Blackie:Glasgow, 1992.

The plasma torch is directed toward a substrate to be coated so as to directly deposit a Cr-bearing layer on the substrate surface over all or a portion of the substrate surface. The time required to form the coating can be controlled by changing the temperature of the chromium organometallic compound in the housing and thus its vapor pressure. In FIG. 1, the substrate is disposed on an alumina support 20 in an open-ended enclosure 22 comprising an open-ended quartz shielding tube. The support 20 and quartz tube 22 are disposed on a support plate 25 that communicates via a slot to a fan-driven exhaust/vent system (not shown). The tube 22 confines the plasma proximate the substrate to be coated.

The substrate and torch typically are disposed in ambient air during the deposition operation; however, the torch can be shielded with an inert gas pursuant to conventional plasma torches or placed in a chamber having a shielding gas, such as argon, therein.

The Examples set forth below describe detailed parameters for practicing the present invention using the inductively coupled plasma torch shown in FIG. 1.

Figure 2:
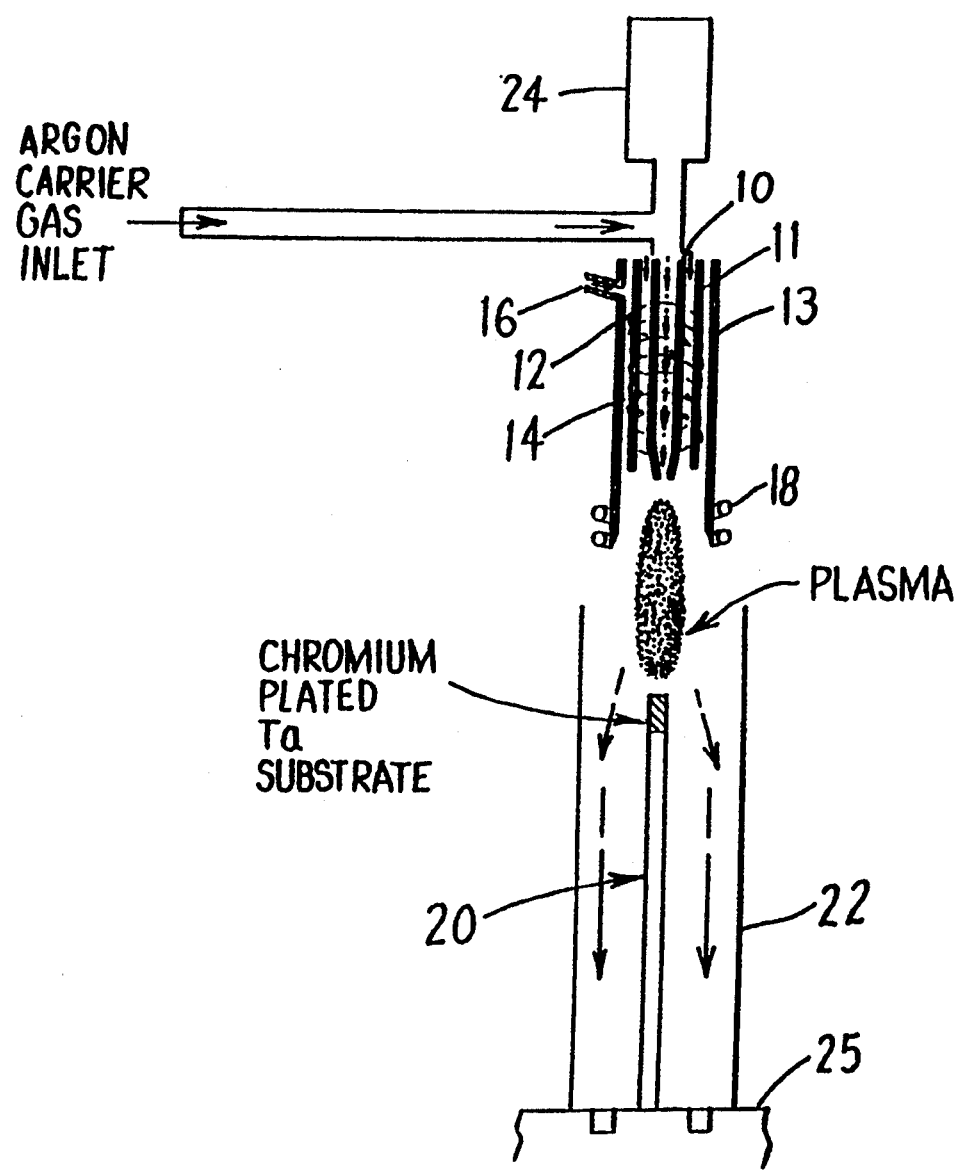
FIG. 2 is a schematic view of an inductively coupled plasma torch for practicing another embodiment of the invention using solid powder of the organometallic compound entrained in a carrier gas.

FIG. 2 illustrates an inductively coupled plasma torch similar to that of FIG. 1 which is supplied with chromium bearing organometallic compound in the form of a solid fine powder (e.g. chromium carbonyl powder of 150-300 microns particle size available from Aldridge Chemical Co., Milwaukee, Wis.) from a powder source 24 for entrainment in an inert carrier gas stream, such as an argon stream, as shown. The solid powder of the organometallic compound entrained in the inert carrier gas stream is introduced into the center tube 10 of the inductively coupled plasma torch for thermal decomposition by the heat of the plasma established proximate the end of the outer tube 13. The torch of FIG. 2 otherwise functions in a like manner to that of FIG. 1 and employs like quartz tubes and coupling coil. In FIG. 2, like reference numerals are used to designate like features of FIG. 1.

Figure 3:
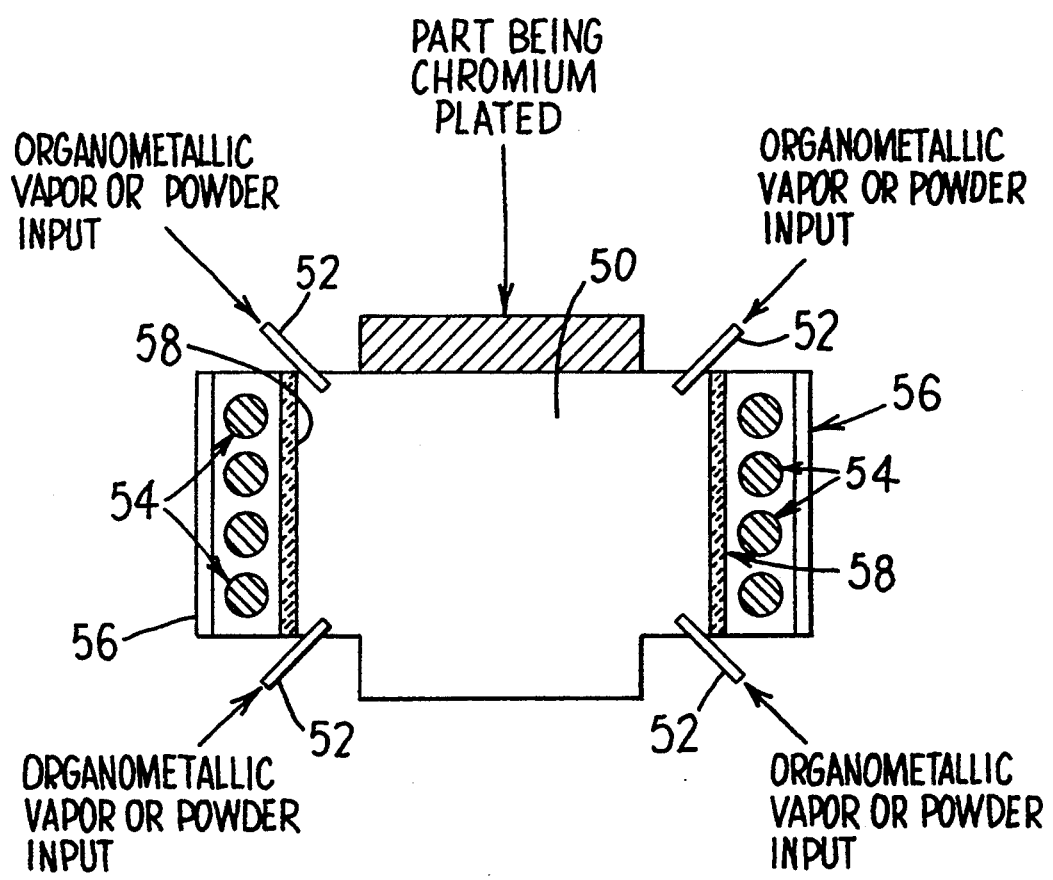
FIG. 3 is a schematic view of an inductively coupled plasma chamber for practicing another embodiment of the invention.
Figure 4A:
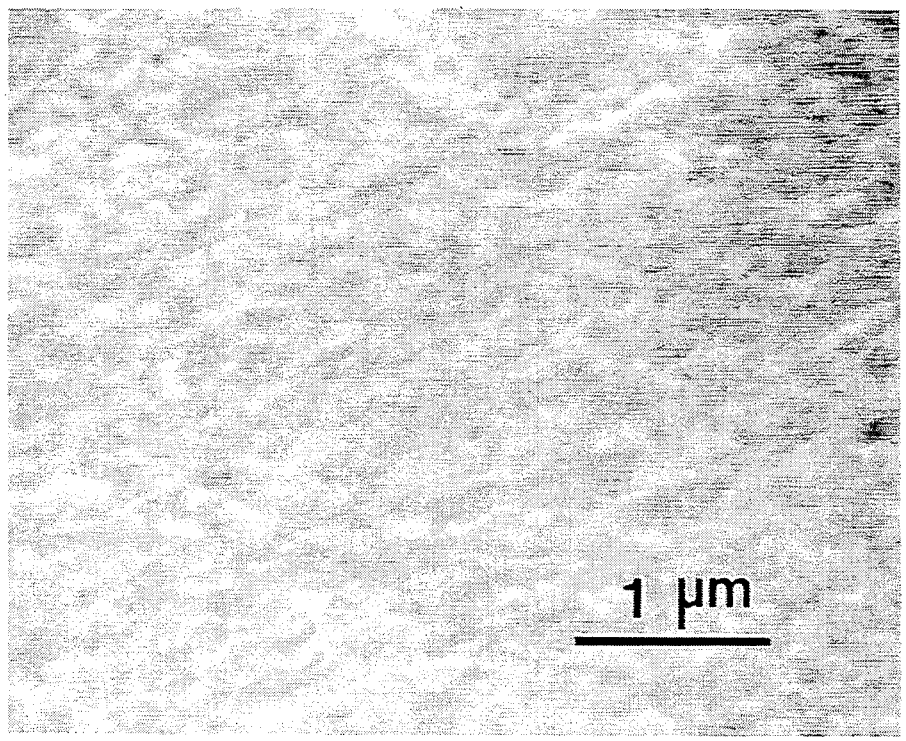
FIGS. 4A and 4B are scanning electron micrographs at low and high magnifications, respectively, taken normal to a metallic chromium coating deposited on a tantalum substrate using the inductively coupled plasma torch of FIG. 1.
Figure 4B:
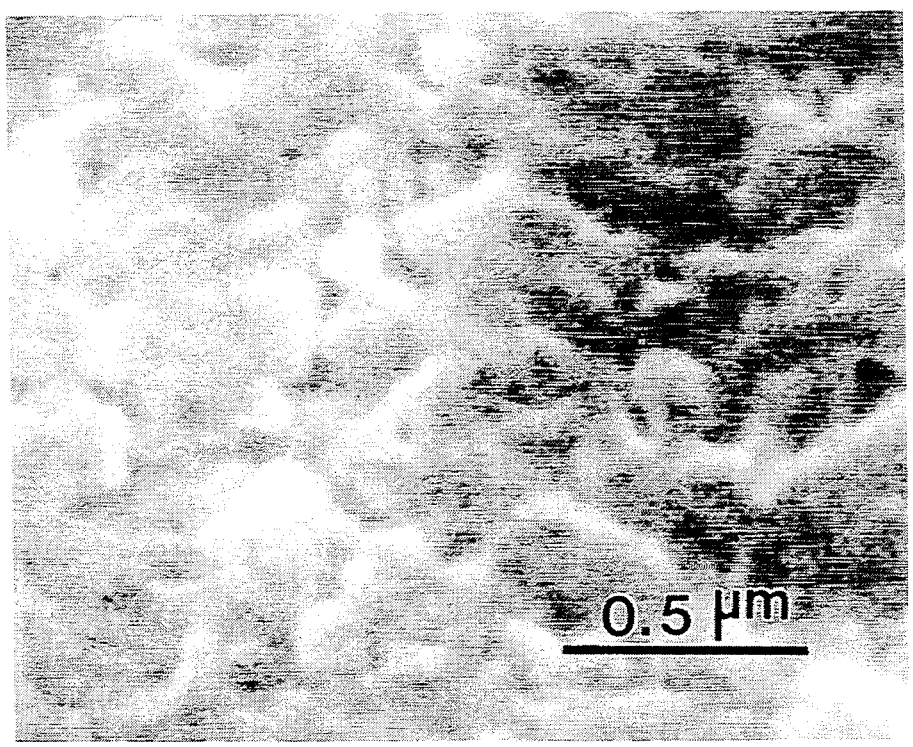
Figure 5A:
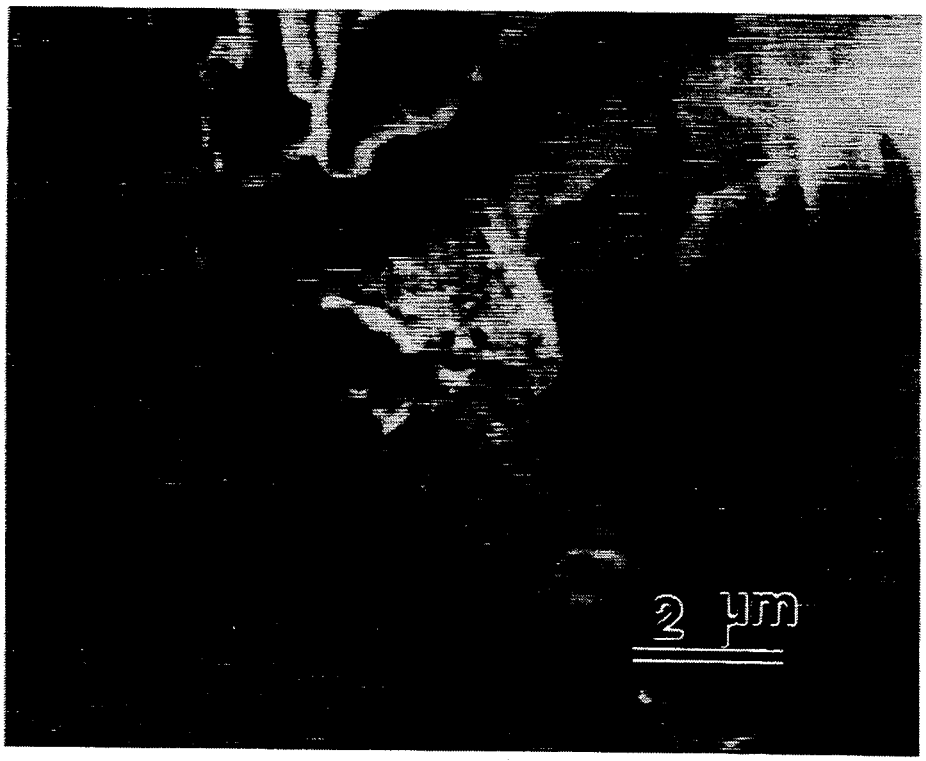
FIGS. 5A and 5B are scanning electron micrographs at low and high magnifications, respectively, of the chromium coating deposited on a tantalum substrate using the inductively coupled plasma torch of FIG. 1. These views are sectional views through the thickness of the coating and substrate with the coating being the white region on the left hand side of the specimens shown.
Figure 5B:
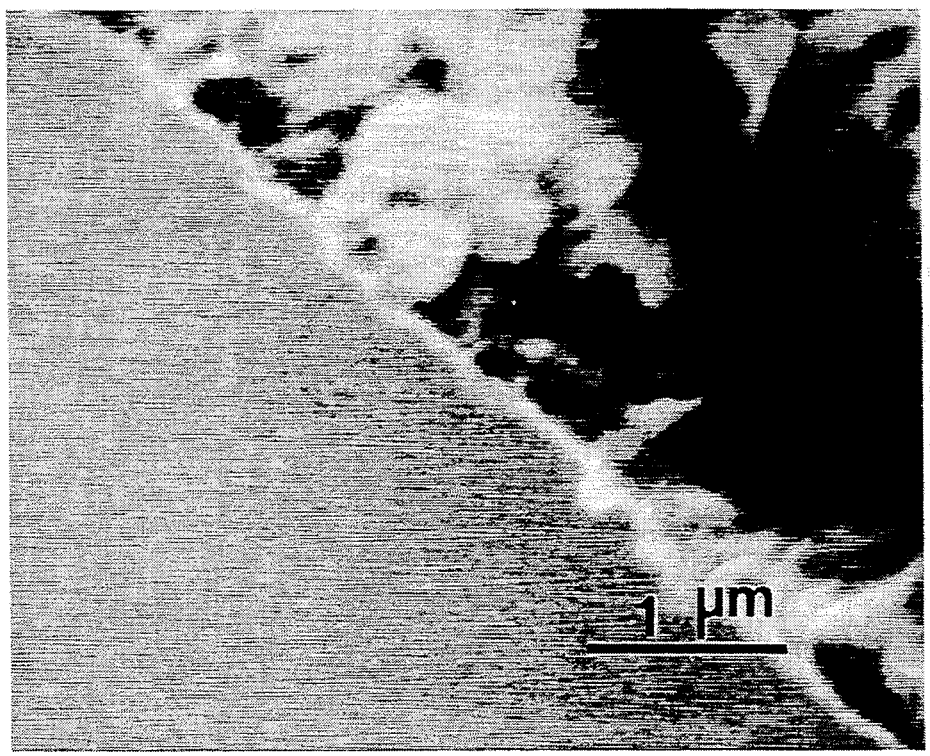

FIG. 3 illustrates still another embodiment of the invention wherein a substrate or part to be coated is disposed (e.g. suspended) in a cylindrical metal chamber 50 (e.g. one foot in diameter and one foot in height) of an inductively coupled plasma device, a chromium bearing organometallic compound and a plasma forming gas (e.g. argon) are introduced into the chamber 50 via input conduits 52, and the organometallic compound and plasma forming gas are heated in the chamber 50 by annular coils 54 inductive coupling that are energized to provide RF (radio frequency) energy to the plasma-forming gas to form a plasma and thermally decompose the organometallic compound for deposition on the substrate surface exposed in the chamber 50. External annular shields 56 are used to direct RF energy toward the chamber 50 and minimize RF energy transmission to the surrounding ambient environment. An internal annular shield 58 is used to retain the plasma proximate of the substrate. Additional deposition cycles can be repeated as required to achieve the chromium coating or layer thickness on the substrate. Alternately, the necessary organometallic and plasma forming gas can be continuously supplied to the chamber 50 to continue deposition of chromium on the substrate surface until the desired coating or layer thickness is built up.

The following Examples are offered to illustrate and not limit the invention.

EXAMPLE 1

A tantalum sheet was employed as a substrate on which a Cr coating was applied using the embodiment of the invention illustrated in FIG. 1. In particular, welder's grade A (or better) argon carrier gas was flowed at a rate of 0.6 liters/minute through a container housing chromium carbonyl solid. The chromium carbonyl was at a temperature of 20° C. (room temperature) where the chromium carbonyl sublimes. A gaseous mixture of chromium carbonyl and argon in proportions of 1:100 on a volume basis was thereby formed and supplied at a flow rate of 0.6 liters/minute to the center tube 10 of an inductively coupled plasma torch. The torch included inner tube 10 having an inner diameter of 5 mm (millimeters) and length of 260 mm. The inner tube was enclosed by intermediate and outer tubes 11, 13 having respective inner diameters of 13 mm and 18 mm and respective lengths of 125 mm and 151 mm. The discharge ends of the inner and intermediate tubes 10 and 11 each were located 66 mm inwardly from the discharge end of the outer tube 13. A two (2) turn water cooled copper coil 18 was disposed about the discharge end of the outer tube 13 and energized at 40.68 MHz to establish a plasma. The plasma was directed at the tantalum substrate spaced 1 cm (centimeter) from the discharge end of the torch. The plasma was directed at the substrate for 30 minutes. The torch and substrate were disposed in ambient air. The substrate was disposed in a quartz shielding tube 22 having an inner diameter of 165 mm. The disc-shaped substrate coated had dimensions of 2.54 cm diameter by 0.5 mm thickness.

The Cr coating produced on the substrate is shown in FIGS. 4A, 4B and 5A, 5B which are scanning electron micrographs of the coating at different magnifications and at different directions. From FIGS. 4A, 4B, it is apparent that a uniform coating was formed on the substrate, the coating having a particle size in the range of 0.2 micron to 0.8 micron. From FIGS. 5A, 5B, the Cr coating thickness is in the range of 0.1 micron to 0.2 micron. The invention contemplates forming thicker coatings; e.g. chromium coatings having a thickness as high as 100 microns or more.

Results of energy dispersive analysis (EDS), X-ray diffraction analysis and Auger analysis of the coating indicate that the coating comprised Cr metal and not chromium oxide even though the substrate and inductively coupled plasma torch were disposed in ambient air during the coating operation. The deposited coating also was subjected to laser source mass spectrometric analysis. Again, the coating was found to comprise Cr metal. Also, the C, N, and O were present in insubstantial concentrations in the coating; e.g. 870 ppm by weight C, 1800 ppm by weight N, and 3000 ppm by weight O.

In accordance with this Example, a Cr alloy layer could be deposited on the substrate by providing a second organometallic compound in the carrier gas to provide the desired alloying element for deposition and alloying with Cr. For example, nickel carbonyl could be provided in suitable concentration in the carrier gas to deposit a Cr—Ni alloy layer on the substrate in the alternative practice of this Example. The relative concentrations of the chromium carbonyl and nickel carbonyl in the carrier gas can be selected to achieve a desired proportion of Cr and Ni in the deposited layer in the alternative practice of this Example.

EXAMPLE 2

A tantalum sheet was coated with a layer comprising chromium oxide (thought to be $Cr_2O_3$) using the procedure of EXAMPLE 1 but changing the proportion of chromium carbonyl to argon to about 1:50 (chromium carbonyl: argon) on a volume basis, rather than the 1:100 proportion used in the previous EXAMPLE 1. This concentration of the chromium carbonyl was achieved by adjusting the feedrate of the chromium carbonyl relative to the carrier gas by raising its temperature to 35°–40° C. in the container, thereby increasing vapor pressure of the chromium carbonyl.

EXAMPLE 3

A tantalum sheet was coated with a layer comprising chromium nitride using the procedure of EXAMPLE 1 but substituting a liquid chromium atraine complex (i.e. a chromium derivative of 1-dimethyl 1 amino -2,8,9-trimethyl-2,8,9-triaza-5-aza-tricyclo [3.3.0] undecane made pursuant to the synthesis procedure described in technical article by J. Am. Chem. Soc. 99 (1972) 631, the teachings of which are incorporated herein by reference) as the organometallic compound for the chromium carbonyl used in EXAMPLE 1. The chromium atraine complex to argon proportion was about 1:100 on a volume basis. The liquid chromium atraine complex at a temperature of 25° C. was entrained in the argon carrier gas.

In an alternative practice of this EXAMPLE 1, a chromium-silicon atraine complex (i.e. chromium/silicon derivative of 1-dimethyl 1 amino -2,8,9-trimethyl-2,8,9-triaza-5-aza-tricyclo [3.3.0] undecane made pursuant to the synthesis procedure described in technical article by J. Am. Chem. Soc. 99 (1972) 631, the teachings of which are incorporated herein by reference) can be used as the organometallic compound in the argon carrier gas to form a chromium silicide layer on the substrate rather than chromium nitride.

EXAMPLE 4

A tantalum sheet was coated with a layer comprising chromium carbide (thought to be $Cr_3C_7$) using the procedure of EXAMPLE 1 but substituting tetra-methyl chromium cryogenically cooled to liquid state as the organometallic compound. The tetramethyl chromium to argon proportion was about 1:100 on a volume basis. The tetramethyl chromium compound was at a temperature of −20° C. (minus 20° C.) and was entrained in the argon carrier gas.

The present invention can be practiced to deposit Cr-bearing coatings or layers as hard or ornamental coatings on a variety of substrates. The Cr-bearing coatings (e.g. Cr metal, Cr alloys, or chromium oxide nitride, carbide, etc.) will have use in electronic, automotive, tooling and myriad other applications on metal, alloy and high temperature plastic and ceramic substrates where electroplated chromium coatings or layers are now used. Ceramics can be coated but the coating may react during deposition with oxide layer on the ceramic to form chromium oxide rather than metallic chromium.

Although certain illustrative features and embodiments of the invention have been described hereinabove and in the drawings, it is to be understood that modifications and changes can be made therein without departing from the spirit and scope of the invention as defined in the appended claims.

The embodiments of the invention in which an exclusive property or privilege is claimed are defined as follows:

1. A method of applying a chromium-bearing layer to at least a portion of a substrate, comprising introducing a chromium bearing organometallic compound in a carrier gas to an inductively coupled plasma to thermally decompose said organometallic compound, and communicating the plasma and the substrate to be coated so as to deposit a chromium-bearing layer on the substrate.

2. The method of claim 1 wherein the inductively coupled plasma is generated by an inductively coupled torch disposed in ambient air.

3. The method of claim 1 wherein said organometallic compound is introduced to the inductively coupled plasma as a vapor in an inert carrier gas.

4. The method of claim 1 wherein said organometallic compound is introduced to the inductively coupled plasma as solid powder entrained in an inert carrier gas.

5. The method of claim 1 wherein the chromium-bearing layer comprises metallic chromium.

6. The method of claim 5 wherein the organometallic compound comprises chromium carbonyl.

7. The method of claim 1 wherein the chromium-bearing layer comprises chromium oxide.

8. The method of claim 7 wherein the organometallic compound comprises chromium carbonyl.

9. The method of claim 1 wherein the chromium-bearing layer comprises chromium nitride.

10. The method of claim 9 wherein the organometallic compound comprises a chromium derivative of 1-dimethyl 1 amino -2,8,9-trimethyl-2,8,9-triaza-5-aza-tricyclo [3.3.0] undecane.

11. The method of claim 1 wherein the chromium-bearing layer comprises chromium carbide.

12. The method of claim 11 wherein the organometallic compound comprises tetramethyl chromium.

13. The method of claim 1 wherein the chromium-bearing layer comprises a chromium alloy with another metal.

14. The method of claim 13 further including an organometallic compound of said another metal.

* * * * *